United States Patent [19]
Lee et al.

[11] Patent Number: 5,715,259
[45] Date of Patent: Feb. 3, 1998

[54] CYCLIC REDUNDANCY CHECK SYNCHRONIZER

[75] Inventors: Bhum Cheol Lee; Sung Yeal Im; Jung Sik Kim, all of Daejeon, Rep. of Korea

[73] Assignees: Electronics and Telecommunications Research Institute, Daejeon; Korea Telecommunication Authority, Seoul, both of Rep. of Korea

[21] Appl. No.: 305,789

[22] Filed: Sep. 14, 1994

[30] Foreign Application Priority Data

Sep. 14, 1993 [KR] Rep. of Korea ............... 1993-18461

[51] Int. Cl.[6] ............................ G06F 11/10; H03M 13/00
[52] U.S. Cl. ............................ 371/42; 371/37.1; 371/37.7
[58] Field of Search ............................ 371/37.1, 37.2, 371/42, 37.6, 37.7

[56] References Cited

U.S. PATENT DOCUMENTS

| | | | |
|---|---|---|---|
| 4,404,676 | 9/1983 | DeBenedictis | 371/47 |
| 5,103,451 | 4/1992 | Fossey | 371/37.6 |
| 5,109,385 | 4/1992 | Karp et al. | 371/42 |
| 5,172,381 | 12/1992 | Karp et al. | 371/42 |
| 5,282,214 | 1/1994 | Dravida | 371/37.6 |
| 5,282,215 | 1/1994 | Hyodo et al. | 371/42 |
| 5,325,372 | 6/1994 | Ish-Shalom | 371/37.6 |
| 5,375,127 | 12/1994 | Leak et al. | 371/40.1 |

OTHER PUBLICATIONS

Pei, Tong-Bi, et al; High-Speed Parallel CRC Circuits in VLSI; IEEE Transactions on Communications, vol. 40, Apr. 1992.

Primary Examiner—Reba I. Elmore
Assistant Examiner—Brian C. Oakes
Attorney, Agent, or Firm—Spencer & Frank

[57] ABSTRACT

A cyclic redundancy check synchronizer includes an N-byte shift register for shifting an input byte string by N bytes and N−1 bytes, a compensation polynomial driver for driving a compensation polynomial by modulo-2-dividing bits of a byte output from the Nth stage of the N-byte shift register by a generator polynomial and shifting the resultant remainder by one bit in a direction toward higher-order bits, and a calculator for inputting bits of an output byte from a remainder register as high-order bits and bits of an input data byte as low-order bits and for performing compensation polynomial modulo-2 subtraction and generator polynomial modulo-2 division for the inputted bits. The cyclic redundancy check synchronizer also includes a block synchronization identifier for searching for syndrome output signals from the calculator at an interval of a byte time to check whether the same syndrome signal is outputted from the calculator successively a predetermined number of times or more at an interval of a block period, and a data selector for selecting bits constituting a byte from among output bits from the N-byte shift register according to a certain one of the syndrome output signals from the calculator resulting in a block synchronous state in response to a data selection signal from the block synchronization identifier to output byte-synchronized data.

13 Claims, 3 Drawing Sheets

CYCLIC REDUNDANCY CHECK SYNCHRONIZER

BACKGROUND OF THE INVENTION

1. Field of the Invention

The present invention relates to a cyclic redundancy check (CRC) synchronizer. CRC is an error detection/correction technique using cyclic codes. More particularly, the present invention relates to a CRC synchronizer which, when the block boundaries of the cyclic codes are not known although the input data is bit-synchronized, outputs byte-synchronized data and a block synchronous state signal. This is accomplished by identifying the block boundaries by calculating a byte string including the cyclic codes successively one byte by one byte.

2. Description of the Prior Art

A conventional CRC circuit is constructed to perform calculations under the condition that the block boundaries are defined. The conventional CRC circuit has the disadvantage that it must repeatedly perform the calculations by the number of bytes constituting every block whenever a byte string of every block is sequentially modified, namely, whenever a codeword of every block is shifted one byte by one byte to a most significant byte and a new least significant byte constitutes every block, to see the block boundaries (Tong-Bi Pei, "High-Speed Parallel CRC circuits in VLSI", IEEE Transactions on Comm. Vol.40, No.4, April 1992).

One example of conventional CRC synchronizers is disclosed in Japanese Laid-open Patent No. Hei 4-284753 entitled "CRC CALCULATION METHOD AND HEC SYNCHRONIZER IN ATM SWITCHING SYSTEM", invented by YOSHIMURA et al., and shown in block form in FIG. 1, herein. As shown in FIG. 1, the conventional CRC synchronizer comprises a CRC calculator 11 for inputting reception data and its own output fed-back, a delay 12 for delaying the output of the CRC calculator 11, a CRC calculation deriver 13 connected to the output of the delay 12, and an equality detector 14 for detecting whether the output of the CRC calculation deriver 13 is equal to the output of the CRC calculator 11.

The conventional CRC synchronizer shown in FIG. 1, which is capable of identifying the block boundaries, can avoid the existing problem of repetitive calculations, resulting in a reduction in the amount of hardware. However, the conventional CRC synchronizer shown in FIG. 1 has a disadvantage in that the input data is required to be byte-synchronized at least. Also, since the result of the CRC calculation is delayed and then compared with that for a new block boundary, the circuit must further be provided with means to compare the results of the CRC calculations with each other. Further, the result of the CRC calculation can be recognized only after the output of the least significant byte of the block.

SUMMARY OF THE INVENTION

Therefore, the present invention has been made in view of the above problems, and it is an object of the present invention to provide a CRC synchronizer for outputting byte-synchronized and block-synchronized data before a start point of every block by identifying block boundaries by merely performing calculations not by the number of bits or bytes constituting every block but by the number of newly additional bytes or the number of bytes excepted from every block although a bit or byte string of every block is sequentially modified.

In accordance with the present invention, the above and other objects can be accomplished by a provision of a cyclic redundancy check synchronizer using a generator polynomial $G(x)=x^r+\ldots+1$ for a block code of N bytes, each of said N bytes having n bits of r authentication bits and m message bits, where r is a natural number, m is a natural number larger than r and n is a natural number of r+m, said cyclic redundancy check synchronizer comprising an N-byte shift register for storing N bytes initialized to logical level "0", said N-byte shift register shifting an input byte string by N bytes and N-1 bytes and outputting the shifted byte string; compensation polynomial driving means for driving a compensation polynomial $C(x)x$ by modulo-2-dividing bits of a most significant byte from said N-byte shift register by said generator polynomial $G(x)$ and shifting the resultant remainder $C(x)$ by one bit to a high-order bit; calculation means for inputting r bits of an output byte from a remainder register storing a previously calculated remainder, as high-order bits, and bits of an input data byte as low-order bits, performing modulo-2 subtraction for the inputted bits on the basis of the compensation polynomial $C(x)x$ driven by said compensation polynomial driving means and then modulo-2 division for the subtracted results on the basis of the generator polynomial $G(x)$ in the order of higher-order bit, discriminating whether the resultant remainders are "0" and outputting the discriminated results as r syndrome signals, respectively; block synchronization identification means for searching for the syndrome output signals from said calculation means at an interval of byte time to check whether the same syndrome signal is outputted from said calculation means successively a predetermined number of times or more at an interval of block period and outputting a data selection signal, a block synchronous state signal and a block synchronization signal in accordance with the checked result; and data selection means for selecting bits constituting a byte among output bits from said N-byte shift register according to a certain one of the syndrome output signals from said calculation means resulting in a block synchronous state in response to the data selection signal from said block synchronization identification means to output byte-synchronized data; whereby block boundaries can be identified on the basis of a byte operation.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

An embodiment of the present invention will be described in detail hereinbelow.

The operation principle of operation of the present invention will first be described on the basis of a mathematical interpretation prior to explaining the embodiment.

Assuming that an n-bit block having a size of n bits is given as $T_k(x)$ at a certain moment k that it is transmitted on the basis of a generator polynomial G(x) and the block boundary is unknown, a bit of a bit string inputted to a CRC circuit at the moment k is given as $a_k$, a bit of the bit string inputted to the CRC circuit at a moment k+1 is given as $a_{k+1}$ and the n-bit block is given as $T_{k+1}(x)$ at the moment k+1, the n-bit block at the moment k can be expressed as follows:

$$T_k(x) = a_{k-n-1}x^{n-1} + B_k(x) + a_k$$

where, $a_{k-n-1}x^{n-1}$ means the most significant bit of the n-bit block at the moment k, $a_{k-n-1}$ means the bit inputted at a moment k−n−1 (n−1th before the moment k), $a_k$ means the least significant bit of the n-bit block at the moment k which is inputted at the moment k and $B_k(x)$ means bits other than the most significant bit and the least significant bit of the n-bit block at the moment k.

Also, the n-bit block at the moment k+1 can be expressed as follows:

$$T_{k+1}(x) = a_{k-n}x^{n-1} + B_{k+1}(x) + a_{k+1}$$

where, $a_{k-n}x^{n-1}$ means the most significant bit of the n-bit block at the moment k+1, $a_{k-n}$ means a bit inputted at a moment k−n, $a_{k+1}$ means the least significant bit of the n-bit block at the moment k+1 which is inputted at the moment k+1 and $B_{k+1}(x)$ means bits other than the most significant bit and the least significant bit of the n-bit block at the moment k+1.

Modulo-2-dividing the n-bit block by the generator polynomial G(x) at the moment k, the result is:

$$\{a_{k-n-1}x^{n-1} + B_k(x) + a_k\}/G(x)$$

If the remainder of $\{a_{k-n-1}x^{n-1} + B_k(x) + a_k\}/G(x)$ is $R_k(x)$ and the remainder of $a_{k-n-1}x^{n-1}/G(x)$ is $C_k(x)$ the remainder of $\{B_k(x) + a_k\}/G(x)$ is $R_k(x) - C_k(x)$.

Since the n-bit block at the moment k+1 can be expressed by $T_{k+1}(x) = \{B_k(x) + a_k\}x + a_{k+1}$, modulo-2-dividing the n-bit block by the generator polynomial G(x) at the moment k+1, the result is:

$$[\{B_k(x) + a_k\}x]/G(x) + a_{k+1}/G(x)$$

Since the remainder of $[\{B_k(x) + a_k\}x]/G(x)$ is $\{R_k(x) - C_k(x)\}x$, the remainder of $T_{k+1}(x)/G(x)$ is the same as that of $\{R_k(x) - C_k(x)\}x + a_{k+1}/G(x)$.

An embodiment of the present invention will now be described hereinbelow.

Figure 1:
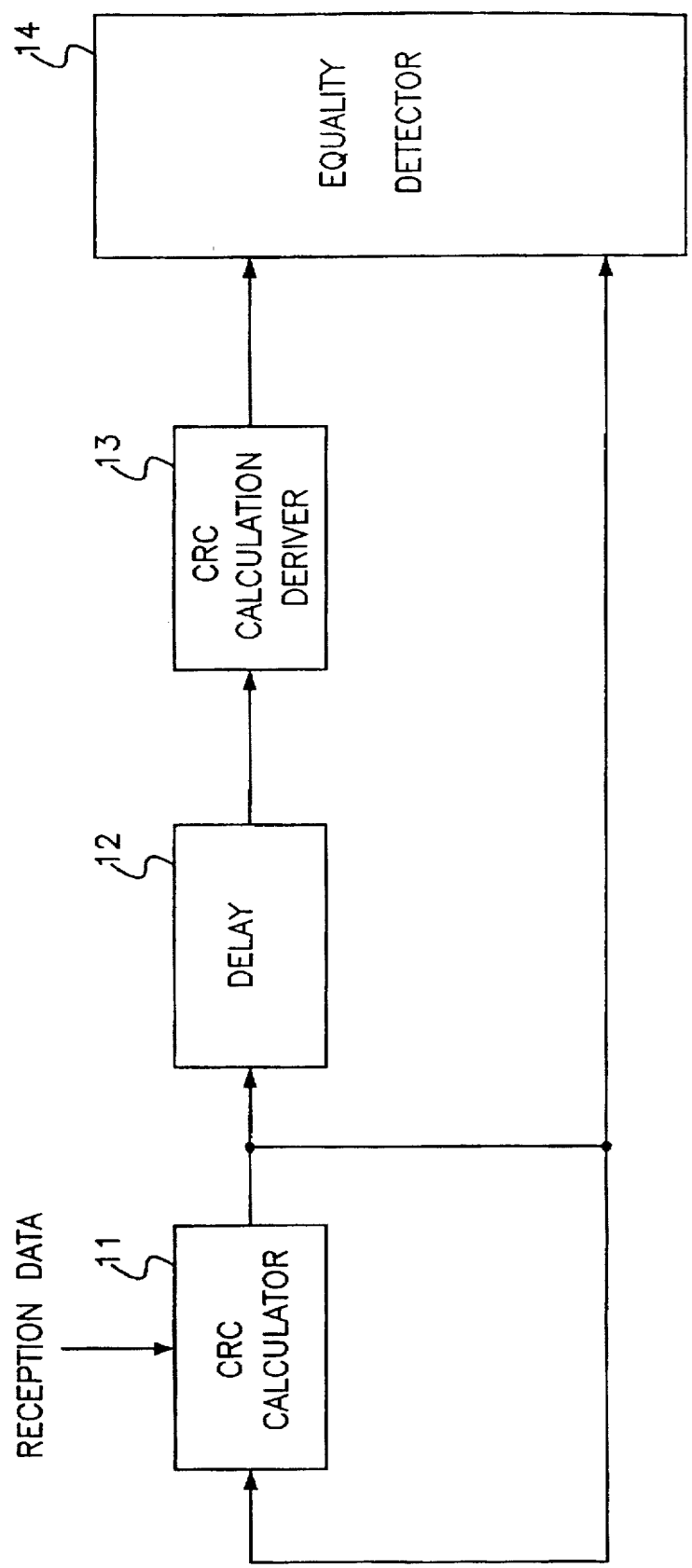
FIG. 1 is a block diagram of a conventional CRC synchronizer which is capable of identifying block boundaries.
Figure 2:
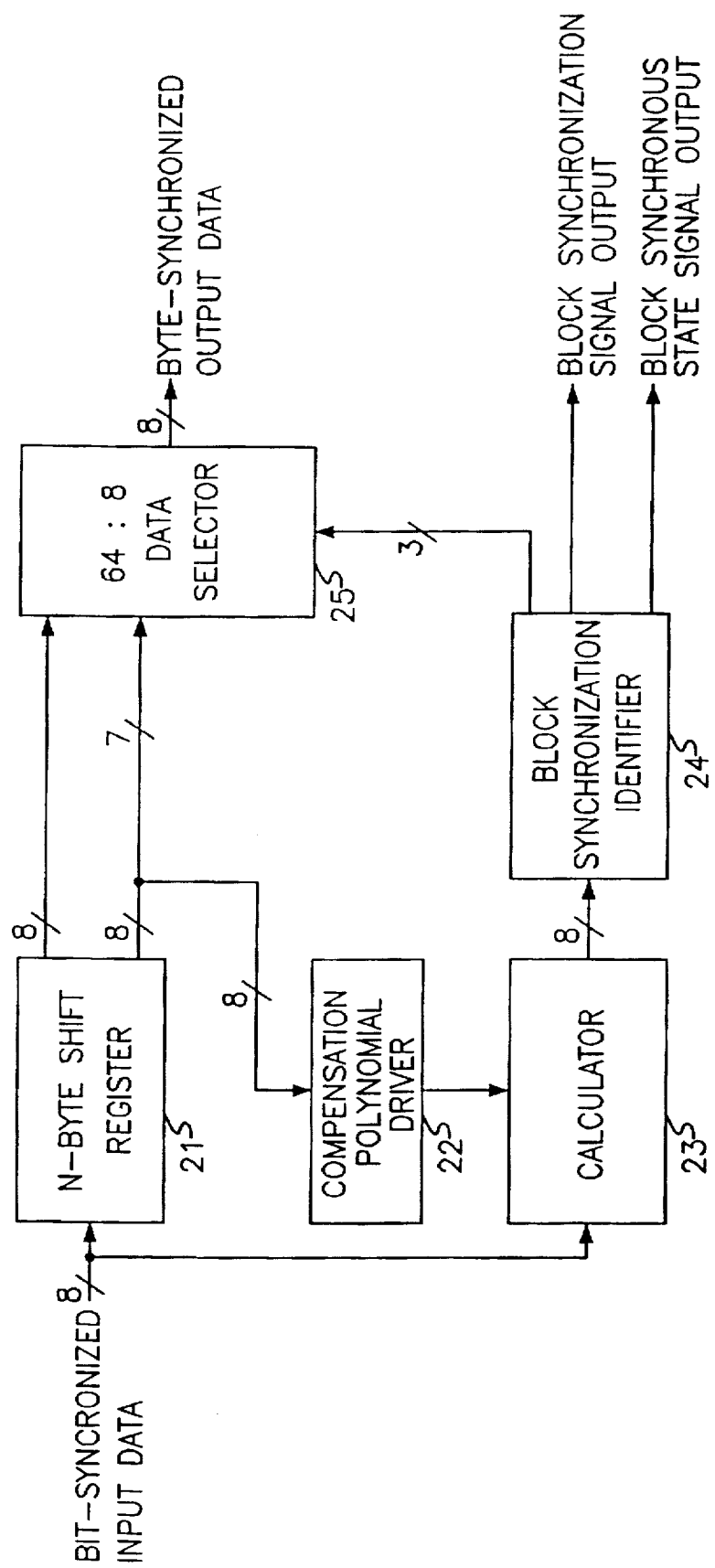
FIG. 2 is a block diagram of a CRC synchronizer which is capable of identifying block boundaries on the basis of a byte operation in accordance with the present invention.

Referring to FIG. 2, there is shown a functional block diagram schematically illustrating the construction of the CRC synchronizer of the present invention. In this drawing, the reference numeral 21 denotes an N-byte shift register, 22 denotes a compensation polynomial driver, 23 denotes a calculator, 24 denotes a block synchronization identifier and 25 denotes a 64:8 data selector, respectively.

The CRC synchronizer of FIG. 2 is capable of identifying block boundaries on the basis of a byte operation in accordance with the present invention. In FIG. 2, the N-byte shift register 21 receives bit-synchronized input data. The compensation polynomial driver 22 is connected to an output of the N-byte shift register 21. The calculator 23 receives the bit-synchronized input data and the output of the compensation polynomial driver 22 to perform compensation polynomial modulo-2 subtraction and generator polynomial modulo-2 division. The block synchronization identifier 24 is connected to the output of the calculator 23. The 64:8 data selector 25 is connected to the output of the N-byte shift register 21 and an output of the block synchronization identifier 24 to output byte-synchronized data.

In the N-byte shift register 21, all N bytes are initialized to logical level "0". Then, a byte string of N bytes is stored in the N-byte shift register 21 by shifting bytes to be decoded sequentially one byte by one byte. At a moment k+N, bits $B_{15}, B_{14}, \ldots, B_8$ of a byte that was inputted at the moment k are outputted from the N-byte shift register 21 to the compensation polynomial driver 22. Also at the moment k+N, bits $B_7, B_6, \ldots, B_0$ inputted at the moment k+1 and all except bit $B_{15}$ of the bits $B_{15}, B_{14}, \ldots, B_8$ that were inputted at the moment k, are outputted from the N-byte shift register 21 to the 64:8 data selector 25.

If the bits that are outputted from the Nth stage of the N-byte shift register 21 are given as $B_{s+8}x^s$, the compensation polynomial driver 22 drives a compensation polynomial $C(x, B_{s+8}x^s)x$ by modulo-2-dividing the bits $B_{s+8}x^s$ of the byte outputted from the Nth stage by the generator polynomial G(x) and shifting the resultant remainder by one bit in the direction toward higher order bits. Here, s is an integer in the range from 0 to 7, $B_s$ is a coefficient of 0 or 1, $B_{15}$ is the coefficient of the most significant bit and is 0 or 1 and $B_8$ is the coefficient of the least significant bit and is 0 or 1. Also, the driven compensation polynomial $C(x, B_{s+8}x^s)x$ can be expressed as follows:

$$C(x, B_{s+8}x^s)x = B_{s+8}x^s\{a_{r-1}x^{r-1} + a_{r-2}x^{r-2} + \ldots + a_2x^2 + a_1x^1 + a_0\}x$$

On the other hand, if the byte from the N-byte shift register 21 is "0", the compensation polynomial driver 22 drives the compensation polynomial $C(x, B_{s+8}x^s)x = 0$.

The calculator 23 inputs bits of an output byte from a remainder register initialized to "0" as high-order bits and bits of an input data byte as low-order bits. The calculator 23 performs modulo-2 subtraction for the inputted bits on the basis of the compensation polynomial driven by compensation polynomial driver 22. First, the calculator 23 performs modulo-2 subtraction for the output bits from the remainder register as the high-order bits and the most significant bit of the input data byte as the low-order bit on the basis of the compensation polynomial $C(x, B_{15}x^7)x$ driven by the compensation polynomial driver 22. The calculator 23 performs modulo-2 division for the subtracted result on the basis of the generator polynomial G(x) and discriminates whether the resultant remainder is "0". The calculator 23 outputs the discriminated result through a first syndrome output terminal RR0 (see FIG. 3). Then, the calculator 23 performs modulo-2 subtraction for bits of the resultant remainder as the high-order bits and the subsequent bit of the input data byte as the low-order bit on the basis of the compensation polynomial $C(x, B_{14}x^6)x$ driven by the compensation polynomial driver 22. The calculator 23 performs modulo-2 division for the subtracted result on the basis of the generator polynomial G(x) and discriminates whether the resultant remainder is "0". The calculator 23 outputs the discriminated result through a second syndrome output terminal RR1. Thereafter, the above operation is repeatedly performed up to the compensation polynomial $C(x, B_8)x$ driven by the compensation polynomial driver 22, so that the results of discriminations whether the remainders are "0" can be outputted through third to eighth syndrome output terminals RR2–RR7, respectively.

The block synchronization identifier 24 is adapted to identify block boundaries in response to the eight syndrome outputs RR0–RR7 of the calculator 23. The block synchronization identifier 24 identifies the block boundaries at two states, a block asynchronous state and a block synchronous state. In the block asynchronous state, the block synchronization identifier 24 performs a byte unit search operation and a block unit search operation.

In the block asynchronous state, the block synchronization identifier 24 searches for the eight syndrome outputs RR0–RR7 of the calculator 23 at an interval of byte time (byte unit search operation). As a result of the search operation, if the result that the remainder is "0" is outputted successively j (j is a natural number) times from a certain one of the syndrome output terminals RR0–RR7 of the calculator 23, the block synchronization identifier 24 declares the block synchronous state and outputs a block synchronous state signal.

In the block synchronous state, if the result that the remainder is not "0" is outputted successively i (i is a natural number) times from the syndrome output terminal of the calculator 23 resulting in the block synchronous state, the block synchronous state is restored to the block asynchronous state. Also, the block synchronization identifier 24 outputs a block asynchronous state signal and performs the byte unit search operation. Also in the block synchronous state, the block synchronization identifier 24 identifies the syndrome output of the calculator 23 resulting in the block synchronous state and outputs the identified result as a 3-bit data selection signal. Here, the result that the remainder is "0" is periodically outputted synchronously with the byte time interval.

The 64:8 data selector 25 is adapted to select bits constituting a byte according to the syndrome output of the calculator 23 resulting in the block synchronous state in response to the data selection signal from the block synchronization identifier 24, to output the byte-synchronized data.

For example, in the case where the block synchronous state is declared on the basis of the first syndrome output RR0 of the calculator 23, the 64:8 data selector 25 outputs a byte consisting the seven bits $B_{14}$, $B_{13}$, ..., $B_8$ from the Nth-stage byte of the N-byte shift register 21 (omitting the most significant bit $B_{15}$), and the most significant bit $B_7$ of the N–1th-stage byte of the N-byte shift register 21, so that $B_{14}$ is the most significant bit of the output byte and $B_7$ is the least significant bit of the output byte. Generally, in the case where the block synchronous state is declared on the basis of the zth (z is 1, 2, 3, 4, 5, 6, 7 or 8) syndrome output RR(z–1) of the calculator 23, the 64:8 data selector 25 outputs a byte consisting of bits $B_{15-z}$, $B_{15-(z-1)}$, ..., $B_8$ of the Nth-stage byte of the N-byte shift register 21 and bits $B_7$, ..., $B_{7-(z-1)}$ of the N–1th-stage byte of the N-byte shift register 21, wherein $B_{15-z}$ is the most significant bit of the output byte and $B_{7-(z-1)}$ is the least significant bit of the output byte.

In other words, in the case where the block synchronous state is declared on the basis of the zth (z is 1, 2, 3, 4, 5, 6, 7 or 8) syndrome output RR(z–1) of the calculator 23 at the moment k+N (k and N are integers representing the byte time interval), a block is formed of high-order bits taken from a byte that was inputted at the moment k+N and low-order bits taken from a byte that was inputted at the moment k. At this time, the block boundary is accurately defined up to a bit unit according to a certain syndrome output of the calculator 23 resulting in the declaration of the block synchronous state. If the block synchronous state is declared on the basis of the zth (z is 1, 2, 3, 4, 5, 6, 7 or 8) syndrome output RR(z–1) of the calculator 23, the 64:8 data selector 25 outputs a byte consisting of bits obtained by omitting the most significant z bits from the bits of the Nth-stage of the N-byte shift register 21 and adding the z most significant bits from the N–1th-stage of the N-byte shift register 21.

Figure 3:
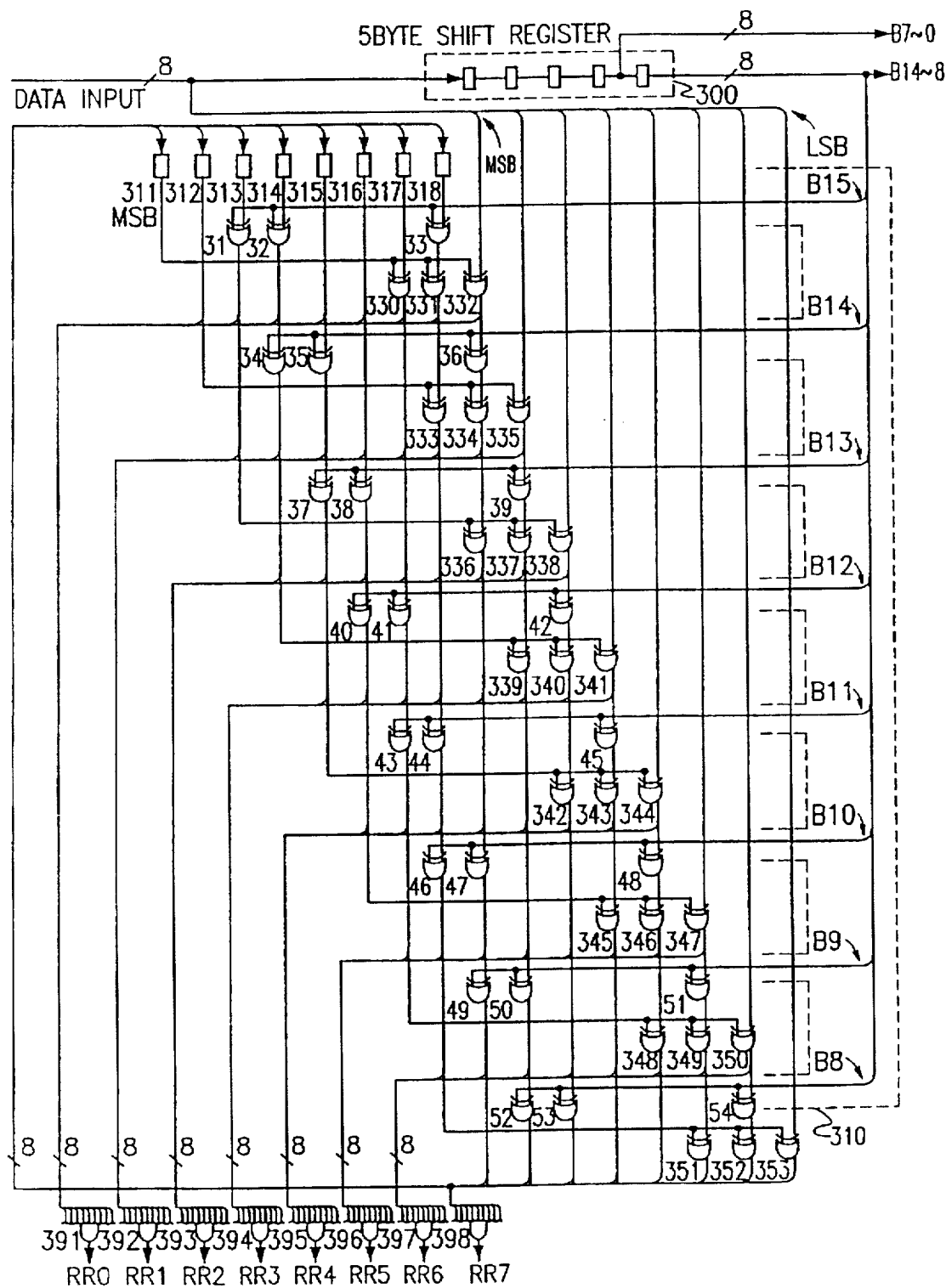
FIG. 3 is a detailed circuit diagram of an N-byte shift register, a compensation polynomial driver and a calculator in FIG. 2 in accordance with an embodiment of the present invention.

Referring to FIG. 3, there is shown a detailed circuit diagram of the N-byte shift register 21, the compensation polynomial driver 22 and the calculator 23 in FIG. 2 in accordance with the embodiment of the present invention. In this drawing, the reference numeral 300 designates a 5-byte shift register, reference numerals 311 to 318 designate D flip-flops, reference numerals 31 to 54 designate exclusive-OR gates for the compensation polynomial modulo-2 subtraction, reference numerals 30 to 353 designate exclusive-OR gates for the generator polynomial modulo-2 division, 310 designate a compensation polynomial driving circuit, and 391 reference numerals to 398 designate 8-input OR gates, respectively.

For an asynchronous transfer mode (ATM) cell used in a user-network interface (UNI) of an ATM system proposed by CCITT, a cyclic code block is 5 bytes (40 bits) in 53 octet, in which the number of authentication bits is 1 byte (8 bits). The generator polynomial G(x) is expressed by $x^8+x^2+x+1$, which is the prime number "100000111" in binary form. The compensation polynomial $C(x,B_{s+8}x^s)x$ is obtained by modulo-2-dividing $x^{39}$ by $x^8+x^2+x+1$ and shifting the resultant remainder $x^5+x^4+1$ by s+1 bits in a direction toward higher-order bits. As a result, the compensation polynomial $C(x,B_{s+8}x^s)x$ is expressed by $B_{s+8}x^s\{x^5+x^4+1\}x$, which is $B_{s+8}x^s(1100010)$ in binary form. For example, the compensation polynomial $C(x,1)x$ is expressed by $\{x^5+x^4+1\}x$ by modulo-2-dividing $x^{39}$ by $x^8+x^2+x+1$ and shifting the resultant remainder $x^5+x^4+1$ by one bit in a direction toward a higher-order bits. In this case, the compensation polynomial $C(x,1)x$ is 1100010 in binary form.

In FIG. 3, the compensation polynomial driving circuit 310 is simply operated on the basis of the previously calculated result by merely using the output of the 5-byte shift register 300. Noticeably, a "0" term is omitted in the calculation circuit for performing the compensation polynomial modulo-2 subtraction and the generator polynomial modulo-2 division, since it is insignificant.

The operation of the CRC synchronizer with the above-mentioned construction in accordance with the present invention will hereinafter be described in detail with reference to FIG. 3.

A data byte string is inputted to a data input terminal of the 5-byte shift register 300 and the calculation circuit for performing the compensation polynomial modulo-2 subtraction and the generator polynomial modulo-2 division. The 5-byte shift register 300 outputs "0" for an initial 5-byte unit interval because it is initialized to logical level "0". For this reason, for the initial 5-byte unit interval, the compensation polynomial driving circuit 310 has no effect on the compensation polynomial modulo-2 subtraction circuit (31–54) and the generator polynomial modulo-2 division circuit (330–353).

At a moment k+5 (k is an integer representing the byte time interval), a block is formed of high-order bits which are bits of a byte inputted at the moment k and low-order bits which are bits of a byte inputted at the moment k+5. After the lapse of the initial 5-byte unit interval, the compensation polynomial modulo-2 subtraction circuit (31–54) and the generator polynomial modulo-2 division circuit (330–353) perform the compensation polynomial modulo-2 subtraction and the generator polynomial modulo-2 division for high-order bits, which are remainder bits, and low-order bits, which are the bits of the byte inputted at the moment k.

In this case, if the most significant bit of the byte inputted at the moment k is logical level "0", the compensation polynomial modulo-2 subtraction circuit (31–54) and the generator polynomial modulo-2 division circuit (330–353) perform the modulo-2 division beginning with a high-order bit of the remainder register (311–318) on the basis of the prime number "100000111" of the generator polynomial.

Then, bits of the resultant remainder are applied to the 8-input OR gate 391, which discriminates whether the resultant remainder is "0" and outputs the discriminated result as the first syndrome signal RR0. On the contrary, if the most significant bit of the byte inputted at the moment k is logical level "1", the compensation polynomial modulo-2 subtraction circuit (31–54) and the generator polynomial modulo-2 division circuit (330–353) perform the modulo-2 subtraction beginning with a high-order bit of the input data byte to be calculated, on the basis of the compensation polynomial $x^7(x^5+x^4+1)$ driven by the compensation polynomial driving circuit 310, and then the modulo-2 division for the subtracted result on the basis of the prime number "100000111" of the generator polynomial. Then, bits of the resultant remainder are applied to the 8-input OR gate 391, which discriminates whether the resultant remainder is "0" and outputs the discriminated result as the first syndrome signal RR0.

If a bit subsequent to the most significant bit of the byte inputted at the moment k is logical level "0", the compensation polynomial modulo-2 subtraction circuit (31–54) and the generator polynomial modulo-2 division circuit (330–353) perform the modulo-2 division for the bits of the above remainder as high-order bits and the subsequent bit of the input data byte as the least significant bit on the basis of the prime number "100000111" of the generator polynomial. Then, bits of the resultant remainder are applied to the 8-input OR gate 392, which discriminates whether the resultant remainder is "0" and outputs the discriminated result as the second syndrome signal RR1. On the contrary, if the bit subsequent to the most significant bit of the byte inputted at the moment k is logical level "1", the compensation polynomial modulo-2 subtraction circuit (31–54) and the generator polynomial modulo-2 division circuit (330–353) perform the modulo-2 subtraction for the bits of the above remainder as the high-order bits and the subsequent bit of the input data byte as the least significant bit on the basis of the compensation polynomial $x^6 (x^5+x^4+1)$ driven by the compensation polynomial driving circuit 310 and then the modulo-2 division for the subtracted result on the basis of the prime number "100000111" of the generator polynomial. Then, bits of the resultant remainder are applied to the 8-input OR gate 392, which discriminates whether the resultant remainder is "0" and outputs the discriminated result as the second syndrome signal RR1. Thereafter, the above operation is repeatedly performed in parallel (byte unit) up to the least significant bit of the byte inputted at the moment k.

Hence, the outputs of the compensation polynomial modulo-2 subtraction circuit (31–54) and the generator polynomial modulo-2-division circuit (330–353) to the D flip-flops 311–318 at the moment k+5 represent the remainders obtained by modulo-2-dividing the blocks inputted from the moment k+1 to the moment k+5 by the prime number "100000111" of the generator polynomial. Provided that at least one of the outputs of the 8-input OR gates 391–398 is not "0", namely, the remainder is not "0", the blocks inputted from the moment k+1 to the moment k+5 are not cyclic code blocks according to a CRC rule.

In the case where a bit of logical level "1" among the bits of a byte (a high-order byte at the moment k) inputted at the moment k+1 is present in the output of the 5-byte shift register 300 at a moment k+6, in the middle of the sequential calculation for the corresponding bit, the modulo-2 subtraction is performed for a polynomial with high-order bits which are output bits from the remainder register (311–318) inputted the remainder of the moment k+5, on the basis of the compensation polynomial, and then the modulo-2 division is performed for a polynomial with low-order bits which are the bits of the byte inputted at the moment k+1, in the unit of bit. Then, discrimination is made through the corresponding 8-input OR gate whether the resultant remainder is "0".

In result, the CRC function is performed in the unit of a byte and, if a cyclic code block is formed, a point that the inputs of each of the eight 8-input OR gates 391–398 are all "0" is established at an interval of a block.

On the other hand, a spurious cyclic code block may be formed because the input data bits have random values. Such a spurious cyclic code block can be detected by checking whether it is periodic or not, which is performed by the block synchronization identifier.

As will be apparent from the above description, according to the present invention, the CRC synchronizer can search for the boundaries of cyclic code blocks of the bit-synchronized input data in the unit of a byte to identify them and output byte-synchronized data. Therefore, the present invention provides the following advantages.

First, even if the boundaries of the cyclic code blocks are modified, the cyclic codes can be duplicated on the basis of the existing calculated result and compensation polynomial. This results in a simplification in construction.

Second, because the cyclic coding is executed in a unit of a byte, low-speed logic devices can be employed.

Third, because the input data is stored in a unit of block size, there is no necessity for employing a separate data delay circuit to match timing between block synchronization detection signals and block data.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A cyclic redundancy check synchronizer using a generator polynomial $G(x)=x^r+ \ldots +1$ for a block code of N bytes, each of said N bytes having n bits of r authentication bits and m message bits, where r is a natural number, m is a natural number larger than r and n is a natural number of r+m, said cyclic redundancy check synchronizer comprising:

an N-byte shift register for storing N bytes initialized to logical level "0", said N-byte shift register shifting an input byte string by N bytes and N−1 bytes and outputting the shifted byte string;

compensation polynomial driving means for driving a compensation polynomial C(x)x by modulo-2-dividing bits of a byte output from said N-byte shift register by said generator polynomial G(x) and shifting the resultant remainder C(x) by one bit in a direction toward higher-order bits;

calculation means for inputting r bits of an output byte from a remainder register storing a previously calculated remainder, as high-order bits, and bits of an input data byte as low-order bits, performing modulo-2 subtraction for the inputted bits on the basis of the compensation polynomial C(x)x driven by said compensation polynomial driving means and then modulo-2 division for the subtracted results on the basis of the generator polynomial G(x), discriminating whether the resultant remainders are "0", and outputting the discriminated results as r syndrome signals, respectively;

block synchronization identification means for searching for the syndrome output signals from said calculation means at an interval of a byte time to check whether the same syndrome signal is outputted from said calculation means successively a predetermined number of times or more at an interval of a block period and outputting a data selection signal, a block synchronous state signal, and a block synchronization signal in accordance with the checked result; and data selection means for selecting bits constituting a byte from among output bits from said N-byte shift register according to a certain one of the syndrome output signals from said calculation means resulting in a block synchronous state in response to the data selection signal from said block synchronization identification means to output byte-synchronized data;

wherein the N-byte shift register has an Nth stage and an (N−1)th stage, the Nth stage and the (N−1)th stage being connected to the data selection means, whereby block boundaries can be identified on the basis of a byte operation.

2. The cyclic redundancy check synchronizer of claim 1, wherein the generator polynomial is $X^8+x^2+x+1$.

3. The cyclic redundancy check synchronizer of claim 1, wherein the calculation means comprises a plurality of Exclusive-OR gates disposed in any array.

4. The cyclic redundancy check synchronizer of claim 3, wherein the array has rows and columns, the Exclusive-OR gates in some of the rows having inputs that are connected to the Nth stage of the shift register.

5. The cyclic redundancy check synchronizer of claim 4, wherein the calculation means further comprises a plurality of OR gates which output the syndrome signals, the Exclusive-OR gates in others of the rows having outputs that are connected to inputs of the OR gates.

6. A cyclic redundancy check synchronizer, comprising:

an N-byte shift register having a plurality of stages, the stages including a first stage which receives parallel input data, a last stage which emits last-stage output data, and a next-to-last stage which emits intermediate data that is shifted into the last stage;

means for generating a plurality of syndrome output signals from the input data and the last-stage output data;

block synchronization identification means for generating a data selection signal from the syndrome output signals; and a data selector which receives the data selection signal along with data from the shift register and which generates byte-synchronized output data by using the data selection signal to select the byte-synchronized output data from among the data received from the shift register, the data which the data selector receives from the shift register including at least some of the last-stage output data and at least some of the intermediate data.

7. The cyclic redundancy check synchronizer of claim 6, wherein the means for generating a plurality of syndrome output signals comprises a remainder register and a plurality of Exclusive-OR gates, at least one of the Exclusive-OR gates having an input which is connected to the remainder register and another input which receives a bit of the input data.

8. The cyclic redundancy check synchronizer of claim 7, wherein at least one of the Exclusive-OR gates has an input which is connected to the remainder register and another input which receives a bit of the last-stage output data.

9. The cyclic redundancy check synchronizer of claim 8, further comprising a plurality of OR gates to generate the syndrome output signals, each OR gate being connected to at least one of the Exclusive-OR gates.

10. The cyclic redundancy check synchronizer of claim 9, wherein some of the Exclusive-OR gates have outputs that are connected to the remainder register and that supply signals which are held in the remainder register.

11. The cyclic redundancy check synchronizer of claim 6, wherein the means for generating a plurality of syndrome output signals comprises a remainder register having a plurality of flip-flops, and a plurality of Exclusive-OR gates that are disposed in an array having rows and columns, some of the columns of the array being connected to the flip-flops and others of the columns of the array receiving bits of the input data, some of the Exclusive-OR gates having outputs that are connected to the flip-flops to supply remainder signals that are held in the flip-flops.

12. The cyclic redundancy check synchronizer of claim 11, wherein the Exclusive-OR gates in alternating rows of the array have inputs that receive bits of the last-stage output data.

13. The cyclic redundancy check synchronizer of claim 6, wherein the block synchronization identification means further comprises means for generating a block synchronization signal and a block synchronous state signal.

* * * * *